US012587137B2

(12) United States Patent
Sjöland et al.

(10) Patent No.: US 12,587,137 B2
(45) Date of Patent: Mar. 24, 2026

(54) RECEIVER CIRCUIT

(71) Applicant: Telefonaktiebolaget LM Ericsson (publ), Stockholm (SE)

(72) Inventors: Henrik Sjöland, Lund (SE); Bengt Edholm, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 279 days.

(21) Appl. No.: 18/031,649

(22) PCT Filed: Oct. 13, 2020

(86) PCT No.: PCT/EP2020/078809
§ 371 (c)(1),
(2) Date: Apr. 13, 2023

(87) PCT Pub. No.: WO2022/078581
PCT Pub. Date: Apr. 21, 2022

(65) Prior Publication Data
US 2023/0396216 A1 Dec. 7, 2023

(51) Int. Cl.
*H03D 7/14* (2006.01)
*H03F 3/45* (2006.01)
*H04B 1/18* (2006.01)

(52) U.S. Cl.
CPC ....... *H03D 7/1466* (2013.01); *H03F 3/45183* (2013.01); *H04B 1/18* (2013.01)

(58) Field of Classification Search
CPC ........... H03F 2200/294; H03F 3/45475; H03F 2200/451; H03F 3/45659;
(Continued)

(56) References Cited

U.S. PATENT DOCUMENTS

| | | | |
|---|---|---|---|
| 6,529,719 B1 | 3/2003 | Imbornone et al. | |
| 9,543,995 B1 | 1/2017 | Fabiano et al. | |

(Continued)

FOREIGN PATENT DOCUMENTS

| | | |
|---|---|---|
| CN | 102377439 A | 3/2012 |
| CO | 5130056 A1 | 2/2002 |

(Continued)

OTHER PUBLICATIONS

Yao, Shaoqin, et al., "A Passive Mixer-First Receiver with Negative Feedback for Impedance Matching", 2017 IEEE 12th International Conference on ASIC (ASICON), IEEE, Oct. 2017, 1-3.
(Continued)

*Primary Examiner* — Ajibola A Akinyemi
(74) *Attorney, Agent, or Firm* — Murphy, Bilak & Homiller, PLLC

(57) ABSTRACT

An example of a receiver circuit is disclosed. The receiver circuit comprises an input for receiving a radio frequency signal, an output for providing an output signal of the receiver circuit, a receive path, wherein the receive path is connected between the input and the output of the receiver circuit, and a feedback path, wherein an input of the feedback path is connected to the output of the receiver circuit. The receiver circuit also comprises a transformer, wherein an output signal of the feedback path is combined with the received radio frequency signal in the receive path to form a first signal. The receive path comprises a first mixer for downconverting the first signal by a local oscillator frequency, and an amplifier for amplifying the downconverted first signal. The feedback path comprises a second mixer for upconverting a signal in the feedback path by said local oscillator frequency. The combination of the output signal of the feedback path with the received radio frequency signal is achieved by means of the transformer.

30 Claims, 5 Drawing Sheets

(58) Field of Classification Search
CPC .......... H03F 2203/45526; H03F 3/195; H03F
3/245; H03F 3/45183; H03F 2203/45544;
H03F 3/62; H03F 2203/45418; H03F
2203/45424
USPC ................................................... 455/552.1
See application file for complete search history.

(56) References Cited

U.S. PATENT DOCUMENTS

| 10,797,647 B1 | 10/2020 | Mokhtari et al. | |
| 2003/0027534 A1* | 2/2003 | Swazey | H03G 5/14 |
| | | | 327/116 |
| 2003/0108096 A1* | 6/2003 | Steinbach | H04L 25/03146 |
| | | | 375/229 |
| 2003/0148792 A1 | 8/2003 | Kimball et al. | |
| 2005/0164669 A1 | 7/2005 | Molnar et al. | |
| 2013/0109337 A1 | 5/2013 | He | |
| 2014/0269864 A1* | 9/2014 | Aparin | H04B 1/40 |
| | | | 375/221 |
| 2015/0295554 A1 | 10/2015 | Heikkinen et al. | |
| 2019/0356271 A1* | 11/2019 | Amorosa | H04L 27/14 |

FOREIGN PATENT DOCUMENTS

| KR | 20130114693 A | 10/2013 |
| KR | 101791706 B1 | 10/2017 |
| WO | 2018119153 A2 | 6/2018 |

OTHER PUBLICATIONS

Kim, Duksoo, et al., "A Blocker-Tolerant Double Noise-Cancelling Wideband Receiver Front-End Using Linearized Transconductor", 2018 IEEE Radio Frequency Integrated Circuits Symposium, RTUIF-5, 2018, 336-339.

Kim, Duksoo, et al., "A Wideband Receiver Front-End Employing Feedback Input Matching and Feed-Forward Blocker Cancelling", The School of Electrical Engineering and INMC, Seoul National University, Seoul, Korea, RFIT 2017, 2017, 43-45.

Koli, Kimmo, et al., "A 900MHz Direct ΔΣ Receiver in 65nm CMOS", Digest of Technical Papers, 2010 IEEE International Solid-State Circuits Conference, Session 3, Cellular Technologies, 3.5, Feb. 8, 2010, 63-65.

Nejdel, Anders, et al., "A Positive Feedback Passive Mixer-First Receiver Front-End", 2015 IEEE Radio Frequency Integrated Circuits Symposium, RMO2B-2, 2015, 79-82.

Prevedelli, D., et al., "A Mixer-1st Auxiliary Receiver for Full-Duplex Self-Interference Cancellation", 2018 New Generation of CAS (NGCAS), Nov. 20, 2018, 162-165.

Rasekh, Amirhossein, et al., "Wide-Band RF Front End for SAW-Less Receivers Employing Active Feedback and Far Out-of-Band Blocker Rejection Circuit", IEEE Journal of Solid-State Circuits, vol. 54, No. 6, Jun. 2019, 1528-1540.

Shreepathi Bhat, Avinash, "Software Defined Radio—Passive Mixer Based Receiver Designs for mmWave Bands", North Carolina State University, Thesis, 2017, 1-129.

Youssef, Shadi, et al., "Active Feedback Technique for RF Channel Selection in Front-End Receivers", IEEE Journal of Solid-State Circuits, vol. 47, No. 12, Dec. 2012, 3130-3144.

Yuan-Ching, Lien, "Enhanced-Selectivity High-Linearity Low-Noise Mixer-First Receiver With Complex Pole Pair Due to Capacitive Positive Feedback", IEEE Journal of Solid State Circuits, vol. 53, No. 5, May 2018, 1348-1360.

Zhu, Jianxun, et al., "Field-Programmable LNAs With Interferer-Reflecting Loop for Input Linearity Enhancement", EEE Journal of Solid-State Circuits, vol. 50, No. 2, Feb. 2015, 556-572.

* cited by examiner

RECEIVER CIRCUIT

TECHNICAL FIELD

This relates to a receiver circuit, and in particular to a receiver circuit for receiving radio frequency wireless signals, and to a communication device including the receiver circuit.

BACKGROUND

In wireless communications, the frequency spectrum below 6 GHz is getting increasingly filled up. The number of frequency bands is high and increasing, and they are heavily used. This poses problems with receiver linearity, having to provide high performance in presence of strong interference. The need for high receiver linearity is further increased by the need to relax filter specifications, in devices like cellular phones, to keep the cost of multi-band solutions with ever larger number of frequency bands under control. At the same time as providing high linearity, the receiver should of course still meet the requirements on low noise and power consumption.

There are different techniques to obtain high linearity in receivers. An important concept is to present a matched impedance only to the narrow band of frequencies at which it is desired to receive signals, and to present a low impedance to other frequencies. The low impedance, ideally zero, will then reflect the signals at these other frequencies, so the signals at these frequencies do not enter the receiver. Thus, the effect of the low impedance is to prevent interfering signals from causing a voltage at the receiver input.

FIG. 1 is a block schematic diagram, showing the general principle for one receiver architecture.

The receiver 10 shown in FIG. 1 is a quadrature receiver, and thus has separate paths 12, 14 for in-phase (I) and quadrature (Q) signals respectively. Only the in-phase path (I-path) 12 is illustrated in detail. The structure of the quadrature path (Q-path) 14 is the same as the structure of the in-phase path 12.

A signal received at the radio frequency input (RF in) 16 of the receiver is applied to a mixer 18, where it is downconverted to baseband by means of a local oscillator signal applied to the mixer 18.

The output of the mixer 18 is applied to an amplifier 20, and then to a low-pass filter 22. The output of the low-pass filter 22 is the output of the in-phase path 12 of the receiver 10. The output of the in-phase path 12 of the receiver 10 and the output of the quadrature path 14 of the receiver 10 together form the quadrature baseband output of the receiver.

Thus, the receiver 10 shown in FIG. 1 is a "mixer first" architecture receiver, in which the received signal is passed direct to the mixer 18, without needing a radio frequency amplifier. This means that the possible RF downconversion frequency span is entirely determined by the mixer and the local oscillator signal. This architecture can have a higher linearity than an architecture including a radio-frequency low noise amplifier for amplifying the received signal, but it will typically not have as high performance in terms of noise. Using a bi-directional mixer, like a passive mixer, the input matching depends on the frequency upconverted baseband impedance.

FIG. 2 is a block schematic diagram, showing a development of the receiver architecture shown in FIG. 1., In this architecture, in order to decouple the input matching from the baseband impedance, and to provide flexibility in controlling both phase and magnitude of the input impedance, frequency translating positive feedback is used. One example of this is disclosed in the document "A positive feedback passive mixer-first receiver front-end", A. Nejdel, M. Abdulaziz, M. Törmänen, H. Sjöland, IEEE RFIC Symposium, 2015, pp. 79-82.

The receiver 30 shown in FIG. 2 is a quadrature receiver, and thus has separate paths 32, 34 for in-phase (I) and quadrature (Q) signals respectively. Only the in-phase path (I-path) 32 is illustrated in detail. The structure of the quadrature path (Q-path) 34 is the same as the structure of the in-phase path 32.

A signal received at the radio frequency input (RF in) 36 of the receiver is applied to a mixer 38 in the forward receive path 40, where it is downconverted to baseband by means of a local oscillator signal applied to the mixer 38.

The output of the mixer 38 is applied to a transimpedance amplifier 42, and then to a low-pass filter 44. The output of the low-pass filter 44 is the output of the forward receive path 40 of the in-phase path 32 of the receiver 30. The output of the in-phase path 32 of the receiver and the output of the quadrature path 34 of the receiver 30 together form the quadrature baseband output of the receiver.

The output of the forward receive path 40 is also applied to a feedback path 46, which includes series connected adjustable resistances 48 and a second mixer 50. The adjustable resistances 48 act to adjust the magnitude of the signal in the feedback path 46.

The second mixer 50 acts to upconvert the baseband output signal of the receive path 40 to the frequency of the received signal, e.g. using the same local oscillator signal that is applied to the mixer 38 as described above.

The upconverted feedback signal generated by the second mixer 50 is then added in the current domain to the input received signal. As the feedback signal is added in phase to the input signal, this is positive feedback.

The passive mixer 38, followed by the transimpedance amplifier 42, present a wideband low input impedance. The mixer first architecture, in which the mixer is connected directly to the receiver input, means that the low input impedance appears at the input.

The bandwidth of the feedback loop is limited, mainly by the combination of transimpedance amplifier 42 and low pass filter 44 (and the corresponding circuitry in the Q-path), which have a pole to perform some channel select filtering and reject interference. The positive shunt feedback (which is narrowband compared to the carrier frequency) boosts the input impedance in the receive channel, around the local oscillator frequency of the two mixers 38, 50.

Adjusting the amplitude of the feedback signal, it is possible to frequency-selectively boost the otherwise low input impedance to match the antenna port impedance in the channel bandwidth.

The addition of feedback will have negligible effect on the noise figure, as the effective shunt feedback resistance can be designed to be large.

This architecture has a good performance, but using positive feedback will in general not provide as high linearity as negative feedback, since negative feedback has the effect of improving linearity, while positive feedback does the opposite. The positive feedback architecture is also inherently sensitive to instability.

SUMMARY

A first aspect of the present disclosure provides a receiver circuit. The receiver circuit comprises an input for receiving a radio frequency signal, an output for providing an output signal of the receiver circuit, a receive path, wherein the receive path is connected between the input and the output of the receiver circuit, and a feedback path, wherein an input of the feedback path is connected to the output of the receiver circuit. The receiver circuit also comprises a transformer, wherein an output signal of the feedback path is combined with the received radio frequency signal in the receive path to form a first signal. The receive path comprises a first mixer for downconverting the first signal by a local oscillator frequency, and an amplifier for amplifying the downconverted first signal. The feedback path comprises a second mixer for upconverting a signal in the feedback path by said local oscillator frequency. The combination of the output signal of the feedback path with the received radio frequency signal is achieved by means of the transformer.

Another aspect of the present disclosure provides a communications device comprising a receiver circuit according to the above aspect.

Examples of this disclosure may have the advantage that the receiver circuit achieves excellent in-band and out-of-band linearity, using a relatively simple structure.

BRIEF DESCRIPTION OF THE DRAWINGS

For a better understanding of the present invention, and to show how it may be put into effect, reference will now be made, by way of example only, to the accompanying drawings, in which.

DETAILED DESCRIPTION

Embodiments will now be described with reference to the accompanying drawings. It will be appreciated that these embodiments are provided by way of example only, and that variations and modifications may be made within the scope of the invention as defined by the claims.

As described above, there are drawbacks to the use of positive feedback, such as increasing non-linearity, and inherent sensitivity to instability.

Figure 1:
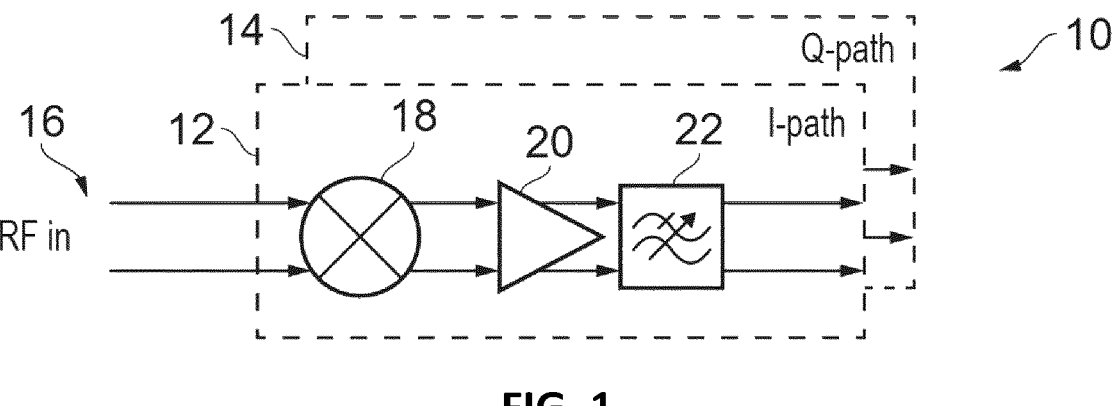
FIG. 1 is a block schematic diagram, showing a first receiver architecture.
Figure 2:
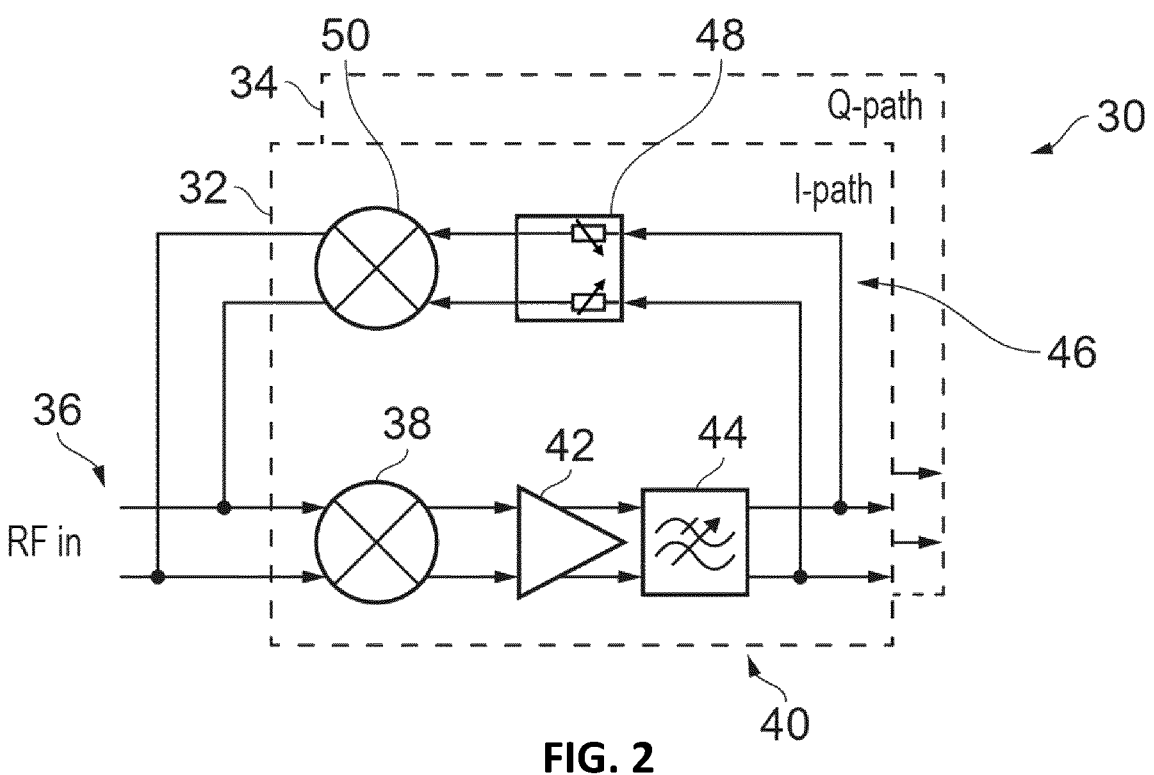
FIG. 2 is a block schematic diagram, showing a second receiver architecture.
Figure 3:
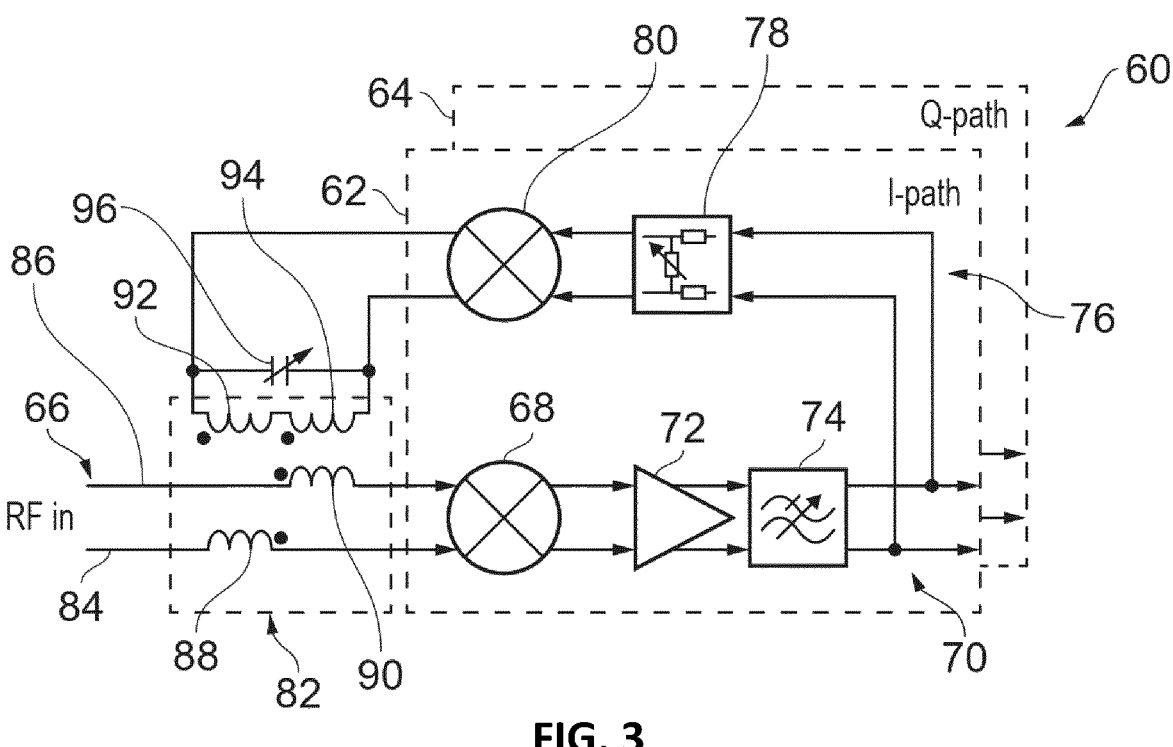
FIG. 3 is a block schematic diagram, showing a receiver architecture in accordance with the present disclosure.

FIG. 3 therefore illustrates a receiver architecture, in which negative feedback is used. As described in more detail below, the feedback path upconverts the attenuated baseband signal to the RF-frequency. By means of a transformer, this signal will effectively be combined (e.g. subtracted from) in the voltage domain with the RF input signal. By adjusting the feedback signal level (and phase), it is possible to match the input to the port impedance, and the addition of the feedback will have negligible effect on the noise figure.

The receiver 60 shown in FIG. 3 is a quadrature receiver, and thus has separate paths 62, 64 for in-phase (I) and quadrature (Q) signals respectively. Only the in-phase path (I-path) 62 is illustrated in detail. The structure of the quadrature path (Q-path) 64 is the same as the structure of the in-phase path 62.

FIG. 3 shows a pair of lines for each signal, and thus illustrates the use of differential signals. However, it will be appreciated that an architecture that uses single-ended signals is also possible.

A signal received at the radio frequency input (RF in) 66 of the receiver is applied to a mixer 68 in the forward receive path 70, where it is downconverted to baseband by means of a local oscillator signal applied to the mixer 68. In other embodiments, the signal may instead be downconverted to an intermediate frequency. In some examples of these embodiments, the separate I and Q lowpass filters 74 may be replaced with a complex bandpass filter.

The mixer 68 in the forward receive path 70 of the in-phase path (I-path) 62 and the mixer in the forward receive path of the quadrature path (Q-path) 64 are passive mixers, and they operate with quadrature signals That is, the same local oscillator frequency is applied to the mixer 68 in the forward receive path 70 of the in-phase path (I-path) 62 and the mixer in the forward receive path of the quadrature path (Q-path) 64, but a phase shift is imposed between the local oscillator signals of the two mixers.

The output of the mixer 68 is applied to a transimpedance amplifier 72, and then to a low-pass filter 74. The output of the low-pass filter 74 is the output of the forward receive path 70 of the in-phase path 62 of the receiver 60. The output of the in-phase path 62 of the receiver and the output of the quadrature path 64 of the receiver 60 may together form a quadrature baseband signal voltage output of the receiver 60, as in-phase (I) and quadrature (Q) voltages. In some examples, the amplifier 72 and filter 74 may be combined as a single block or component.

The output of the forward receive path 70 is also applied to a feedback path 76, which includes a voltage divider 78 and a second mixer 80. The voltage divider 78 is a passive voltage divider, which may appear before and/or after the mixer 80 in the feedback path.

The voltage divider 78 acts to adjust the magnitude of the signal in the feedback path 76.

The second mixer 80 receives the same local oscillator frequency signal as the mixer 68 in the forward receive path, and thus acts to upconvert the baseband output signal of the receive path 70 to the frequency of the received signal.

The upconverted feedback signal generated by the second mixer 80 is then combined with (e.g. subtracted from) the input received signal. As the feedback signal is subtracted from the input signal in some examples, this is negative feedback.

The combination takes place by means of a transformer 82.

Specifically, the input lines 84, 86 of the receiver 60 include respective windings 88, 90. A further winding, made of two sections 92, 94, is connected across the lines at the output of the feedback path 76. The arrangement is such that there is a mutual inductance between the winding 88 on one input line and a first section 92 of the feedback path winding, and such that there is a mutual inductance between the winding 90 on the other input line and a second section 94 of the feedback path winding. The arrangement is further such that the signal on the feedback path 76 is combined with (e.g. subtracted from) the received signal.

In some examples, the quadrature path 64 may be connected to the transformer 82 in parallel with the in-phase path 62. In case passive mixers 80 are used, in some examples, the local oscillator signals of the mixers may be non-overlapping between the in-phase and quadrature paths. In such examples, the feedback signals on both paths can simply be connected together. Due to the non-overlapping local oscillator signals, when one mixer is active, the other is in high impedance, and vice versa.

A controllable capacitance 96 is also connected across the lines at the output of the feedback path 76.

Thus, the receiver 60 uses narrow-band frequency translating negative feedback, which provides an accurate and controllable input impedance at the frequencies of the signal to receive. At other frequencies the input impedance is low, so that disturbances are reflected due to the mismatch.

The receiver is a mixer first structure, with a quadrature passive mixer followed by transimpedance amplifiers 72. The low input impedance of the transimpedance amplifiers 72 causes the passive mixer 68 to operate in current mode and yield a low input impedance. At the output of the low pass filters 74 the baseband signal information is available as in-phase (I) and quadrature (Q) voltages.

These voltages are divided by passive voltage dividers 78, and fed to quadrature mixers 80 generating a high frequency feedback signal. This feedback signal is combined with (e.g. subtracted from) the receiver input using a transformer 82, which then accurately sets the receiver input impedance in the bandwidth of the feedback loop. The bandwidth is set by the low pass filter 74, or by a pole of the transimpedance amplifier, which is controlled by the R-C shunt feedback impedance of the transimpedance amplifier, as described in more detail below. The transimpedance amplifier 72 can then also include the function of the lowpass filter 74 in some examples.

The receiver input impedance is set by the ratio of the feedback voltage signal from the transformer to the input current of the mixer. In the total receiver input impedance, the non-zero mixer input impedance is added to this ratio, but it is much lower than the ratio in a well-designed circuit. The magnitude of the ratio is controlled mainly by the transimpedance amplifier 72 (e.g. a feedback resistor associated with the transimpedance amplifier 72), determining the forward gain, and the passive voltage divider 78 in the feedback path. In some examples, the input impedance may be programmable or dynamically adjusted. For example, the feedback resistors in the passive voltage dividers 78 (in the in-phase path and/or the quadrature path) may include digitally programmable resistors, such as a bank of resistors that are controlled using MOS-transistor switches. In some examples, the impedance due to the feedback (equal or approximately equal to the above-mentioned ratio) may be larger or much larger than the input impedance of the forward path. If that is not the case, the performance improvement achievable by using feedback may be limited in some cases. The mixer 68 input impedance (when connected to the amplifier 72) may in some examples be no more than 10 to 20% of the total input impedance, e.g. at least to 90% of the input impedance may be due to the feedback in a well-designed circuit.

The phase of the ratio can also be controlled, by applying a phase difference between the local oscillator signals applied to the forward path mixer 68, and the feedback mixer 80. This can be done in any one or more of a number of suitable ways. For example, variable delay lines may be applied to the LO signals. Alternatively, contributions for the I-path may be added to or subtracted from the Q-path, and vice versa, i.e. a baseband coordinate rotation. This could be realized for example by adding controllable resistors to the resistive voltage dividers, also having a set of crossed resistors and a set of non-crossed resistors (to handle both positive and negative rotation) from I to Q and vice versa. These may be for example in addition to the existing resistors 148a and 148b in FIG. 4, described more fully below.

Using negative feedback means that the linearity of the circuit is improved compared to positive feedback, especially intermodulation performance.

Figure 4:
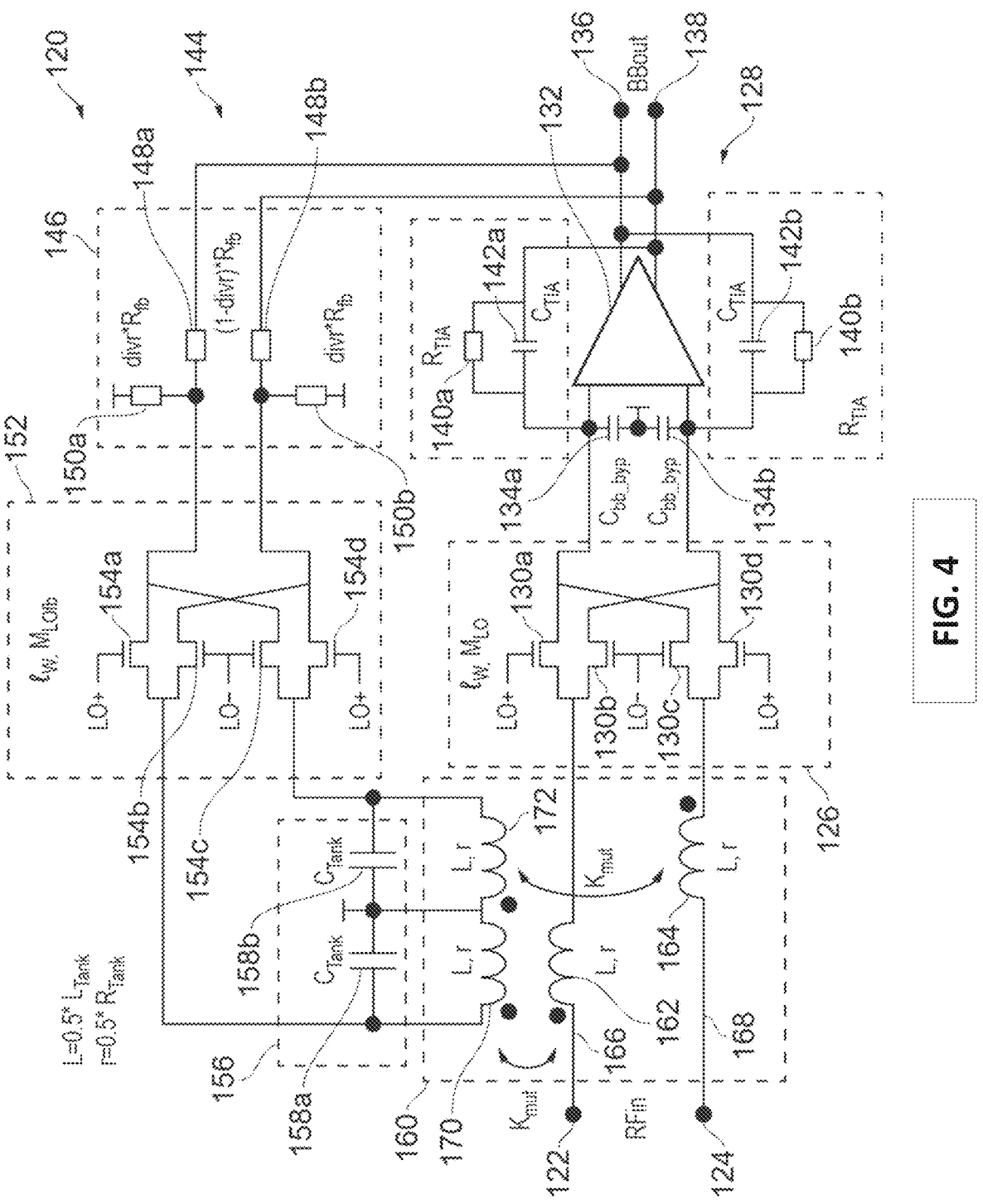
FIG. 4 is a schematic diagram, showing in more detail a receiver in accordance with the receiver architecture of FIG. 3.

FIG. 4 shows in more detail the form of the receiver circuit 60 of FIG. 3, in one illustrative embodiment.

As noted above, the receiver 60 shown in FIG. 3 is a quadrature receiver, and thus has separate paths 62, 64 for in-phase (I) and quadrature (Q) signals respectively.

In the case of a quadrature receiver, with two paths, the received signal is applied to the two paths, which each include mixers in the forward path and in the feedback path, and there is a phase difference between the local oscillator signals that are applied to the mixers in the in-phase path and the quadrature path.

More generally, the receiver may be any multi-phase receiver, with a plurality of paths.

In FIG. 4, to avoid overcomplicating the figure, only one of the plurality of paths is shown.

Specifically, FIG. 4 shows a receiver 120 with a pair of input terminals 122, 124 at the radio frequency input (RF in) for receiving a differential signal. However, it will be appreciated that a receiver that operates with single-ended signals is also possible.

A signal received at the radio frequency input (RF in) of the receiver is applied to a passive mixer 126 in the forward receive path 128.

The mixer 126 in this illustrated example is a double balanced passive mixer, including CMOS transistors 130a, 130b, 130c, 130d, to which the positive and negative local oscillator signals (LO+ and LO−) are applied. In one embodiment, the CMOS transistors 130a, 130b, 130c, 130d have channel lengths of 20 nm, each with a total channel width of 240 μm. However, this is merely one specific example and any suitable values may be used in other examples.

The mixer 126 acts to frequency downconvert the received signal to baseband, and the baseband output of the mixer 126 is applied to a transimpedance amplifier 132.

A pair of bypass capacitors 134a, 134b are provided across the input terminals of the amplifier 132, in order to shunt current of out-of-band signals to signal ground, reducing intermodulation distortion in the transimpedance amplifier. In one embodiment, the capacitors 134a, 134b each have a capacitance value of 32 pF. However, this is merely one specific example and any suitable values may be used in other examples.

The structure of the transimpedance amplifier 132 is described in more detail below, but at this stage it is enough to say that the transimpedance amplifier 132 converts the current output of the mixer 126 to a baseband voltage output BBout on the output terminals 136, 138 of the receiver circuit.

Low pass filtering of the baseband voltage output is achieved by a pair of feedback resistors 140a, 140b, each in parallel with a respective feedback capacitor 142a, 142b. In one embodiment, the feedback resistors 140a, 140b have resistance values of 4 kΩ, and the feedback capacitors 142a, 142b have capacitance values of 6 pF. However, this is merely one specific example and any suitable values may be used in other examples.

The feedback resistors 140a, 140b in the transimpedance amplifier 132 may for example be selected to yield a total gain from RF input to output of about 30 dB. The feedback capacitors 142a, 142b may for example be selected to give a receive bandwidth of about 10 MHz. The in-band voltage gain of the circuit may be determined as follows. For example, the in-band voltage gain may be proportional to the value of the feedback resistors 140a and 140b. Therefore, for example, if 6 dB more gain is desired, the resistances should hence be doubled. The bandwidth is inversely proportional to the RC product of feedback resistors 140 and feedback capacitors 142. When increasing gain by increasing R, to maintain the bandwidth, C may be reduced by the same factor. On the other hand, to change bandwidth and not gain, the capacitance of the capacitors 142 may be changed while not changing the resistance of the resistors 140. For example, the bandwidth can be halved by doubling the capacitance of the feedback capacitors 142a and 142b and keeping the resistors unchanged.

As discussed previously, the baseband voltage output BBout on the output terminals 136, 138 of the receiver circuit and the output of the corresponding circuit may together form a complex baseband signal voltage as an output of the receiver.

The output of the forward receive path 128 is also applied to a feedback path 144, which includes a passive voltage divider 146. The voltage divider 146 includes a respective resistor 148a, 148b in each signal line, with an associated resistor 150a, 150b connected to signal ground.

In one embodiment, the sum of the resistances of each pair of resistors, that is, the sum of the resistances of the resistors 148a and 150a, and of the resistors 148b, 150b, is 1000. This sum is split with the resistors 148a, 148b in each signal line having resistance values of 96.250, and the resistors 150a, 150b that are connected to ground having resistance values of 3.750. However, this is merely one specific example and any suitable values may be used in other examples.

The voltage divider 146 thus acts to adjust the magnitude of the signal in the feedback path 144.

The signal in the feedback path is then applied to a second mixer 152, which receives the same local oscillator frequency signal as the mixer 126 in the forward receive path, and thus acts to upconvert the baseband output signal of the receive path 144 to the frequency of the received signal.

The second mixer 152 in this illustrated example is a double balanced passive mixer, including CMOS transistors 154a, 154b, 154c, 154d, to which the positive and negative local oscillator signals (LO+ and LO−) are applied. In one embodiment, the CMOS transistors 154a, 154b, 154c, 154d have channel lengths of 20 nm, each with a total channel width of 60 μm.

As mentioned previously, the voltage divider 146 may appear before and/or after the second mixer 152 in the feedback path.

A capacitance 156 is connected between the two signal lines of the feedback path, and this is made up of two segments 158a, 158b, which in one embodiment each have a capacitance value of 14 pF. However, this is merely one specific example and any suitable values may be used in other examples.

The resulting signal is then combined with (e.g. subtracted from) the input signal by means of a transformer 160.

The transformer 160 comprises respective windings 162, 164 in the input lines 166, 168 of the receiver 120. A further winding, made of two sections 170, 172, is connected between the two signal lines at the output of the feedback path 144. The connection point of the two winding sections 170, 172 may be connected to the connection point of the two capacitor segments 158a, 158b.

The arrangement of the windings is such that there is a mutual inductance between the winding 162 on one input line and a first section 170 of the feedback path winding, and such that there is a mutual inductance between the winding 164 on the other input line 30 and a second section 172 of the feedback path winding. The arrangement is further such that the signal on the feedback path 144 is combined with (e.g. subtracted from) the received signal before being input to the mixer 126.

In one embodiment, each of the windings 162, 164 in the input lines 166, 168 of the 35 receiver 120, and each of the winding sections 170, 172 in the feedback path 144, has an inductance of 300 pH, and a parasitic series resistance of 0.19 D. However, this is merely one specific example and any suitable values may be used in other examples.

There is a mutual coupling factor of 0.8 in some examples between the winding 162 and the winding section 170, and between the winding 164 and the winding section 172.

Thus, the receiver 120 uses narrow-band frequency translating negative feedback, which provides an accurate and controllable input impedance at the frequencies at which it is desired to receive signals. At other frequencies the input impedance is low, so that disturbances are reflected due to the mismatch.

The frequency where the input impedance is tuned to the desired value may in some examples track the local oscillator frequency. However, in some examples, the range is limited by the tuned transformer. Therefore, if a wider frequency range of operation is desired, some (coarse) tuning may need to be applied to the capacitors 158.

The receiver input impedance is set by the ratio of the feedback voltage signal from the transformer to the input current of the mixer. In the total receiver input impedance, the non-zero mixer input impedance is added to this ratio, but it is much lower than the ratio in a well-designed circuit. The magnitude of the ratio is controlled mainly by the feedback resistors 140a and 140b in the transimpedance amplifier, determining the forward gain, and the passive voltage divider 146 in the feedback path.

By adjustment of the feedback, the input impedance of the receiver 120 can be optimized for matching, while at the same time the input impedance of the mixer 126 may be low, which may enable high linearity.

Thus, to summarise, the receiver 120 shown in FIG. 4 has a transformer 160 at the input, combining a feedback voltage with the input signal, with the feedback voltage coming from a frequency up-conversion mixer 152 that has a baseband frequency input. The feedback is negative, i.e. acting to reduce the output signal level of the receiver. The forward path of the receiver has a low input impedance, and performs frequency down-conversion to baseband frequencies, with the frequency down-conversion being performed by a passive mixer 126 followed by a transimpedance amplifier 132.

The transimpedance amplifier 132 shown in FIG. 4 can be implemented in many ways.

Figure 5:
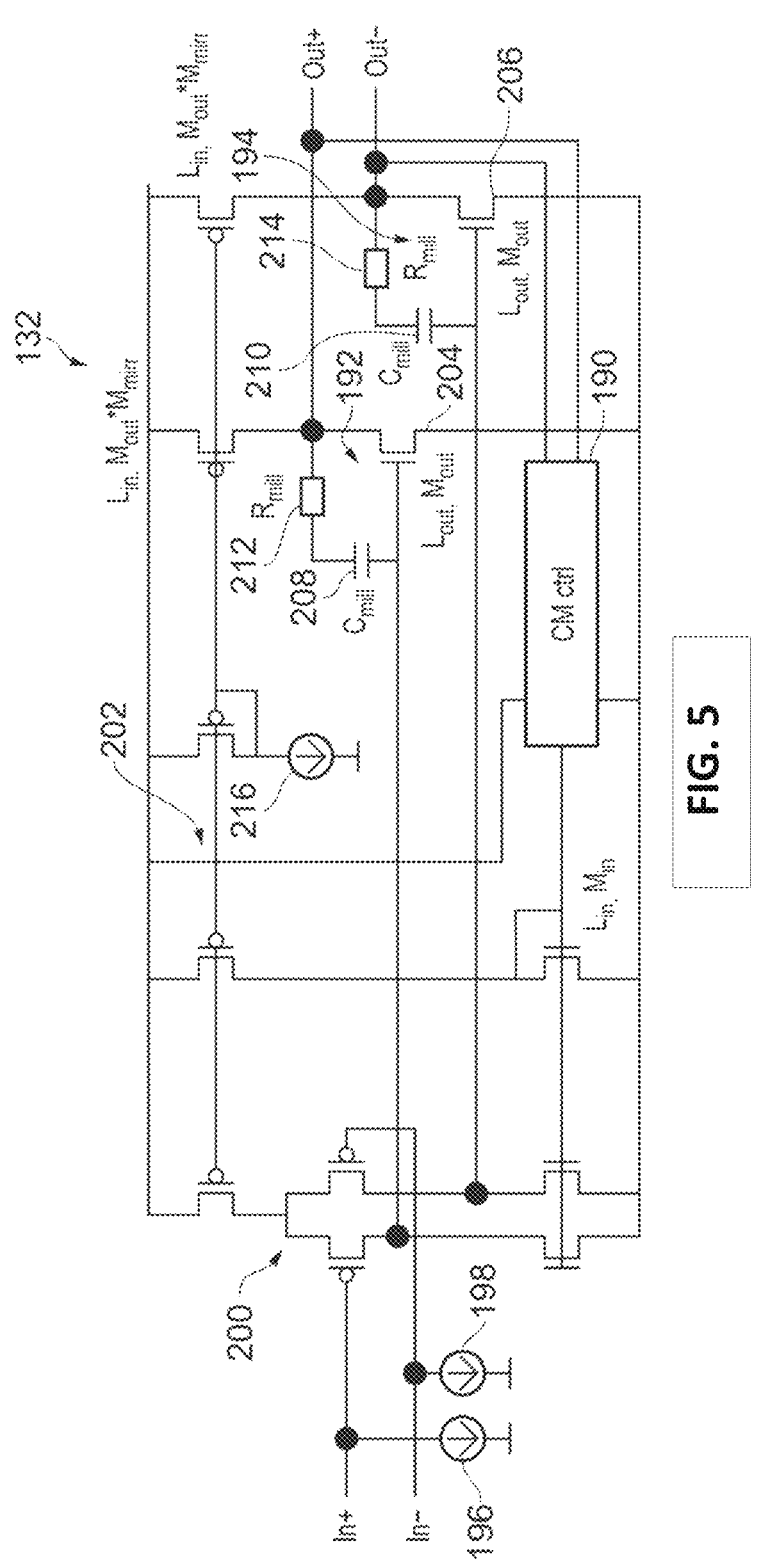
FIG. 5 is a schematic diagram, showing in more detail a part of the receiver of FIG. 4.

FIG. 5 shows the form of one illustrative example of a suitable transimpedance amplifier 132, which in this case is a simple class-A fully differential two stage operational amplifier with a common-mode control loop.

The common-mode control 190 regulates the DC common-mode voltage of the output stages 192, 194 to half the supply voltage, e.g. at 400 mV for a supply of 800 mV. The input DC voltage is shifted lower, to about 250 mV, by means of two current sources 196, 198 connected to the input, In+, In−, of the amplifier 132. The current sources can be implemented using NMOS transistors. The current sources 196, 198 are chosen such that their DC current will create a 150 mV DC drop over the feedback resistors 140*a*, 140*b* seen in FIG. 4. That is, the value of the current supplied by each of the current sources 196, 198 is 150 mV, divided by the resistance of each feedback resistor 140*a*, 140*b*. This helps to bias the PMOS input pair 200 such that there is sufficient headroom for the PMOS current mirror 202 controlling the tail current.

In one embodiment, where all the transistors have a unit with of 10 um, the transistors of the input pair 200 have channel lengths of 200 nm, and multiplicators of 750; the transistors of the current mirror 202 have channel lengths of 200 nm, and multiplicators for the output transistors of 400 and the input transistor of 20, making the current scale up by 20; the reference current for the current mirror 202 supplied by the current source 216 is 700 ρA; the transistors 204, 206 of the output stages 192, 194 respectively have channel lengths of 20 nm, and multiplicators of 20; and the values of the Miller capacitances 208, 210 and Miller resistances 212, 214 are 230 fF and 10Ω, respectively.

Thus, the architecture shown in FIG. 3, and described in more detail with reference to FIGS. 4 and 5, has a high degree of linearity, both in-band and out-of-band, due to the negative feedback linearizing the circuit.

The effect of the transimpedance low-pass filtering caused by the feedback resistors 140*a*, 140*b* and feedback capacitors 142*a*, 142*b* around the transimpedance amplifier 132 is that the feedback to the receiver inputs drops so the input impedance becomes low-ohmic as the received RF input signal moves away from the local oscillator frequency. At even higher frequency offsets the bypass capacitors 134*a*, 134*b* at the input of the of the amplifier 132 will help to attenuate blockers by shunting their current to signal ground, preventing them from creating intermodulation in the amplifier. The bypass capacitors 134*a*, 134*b* contribute to further reduction of the input impedance and increase of the mismatch, as desired.

The architecture shown in FIG. 3, and described in more detail with reference to FIGS. 4 and 5 also has a programmable input impedance, and may for example use only a single transformer, with no additional inductors.

Figure 6:
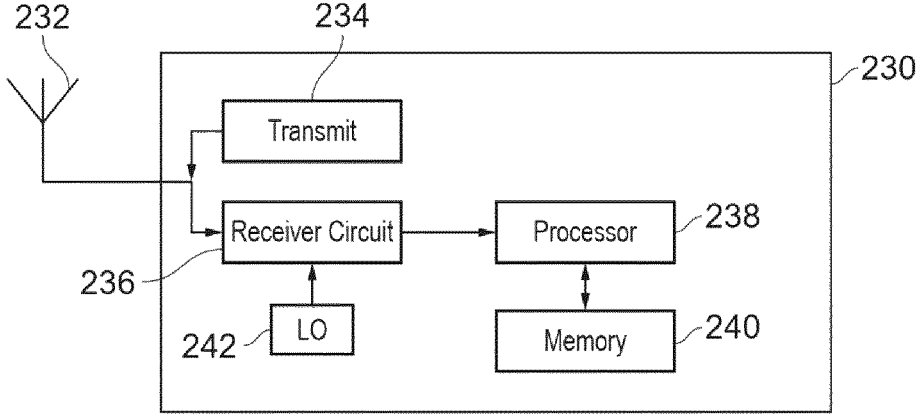
FIG. 6 is a block schematic diagram, showing a communications apparatus incorporating the receiver of FIG. 3 or FIG. 4.

FIG. 6 is a block schematic diagram, showing a communications apparatus incorporating the receiver of FIG. 3 or FIG. 4.

Specifically, FIG. 6 shows a communications device 230, which may for example be a mobile phone, a laptop or tablet computer, a wireless sensor, or the like, generally referred to as a User Equipment device. In addition, the communications device may be a node of a communications network, for example a node of a Radio Access Network, such as a base station, a relay, or a remote radio unit. It will be appreciated that the communications device 230 will have other features and functions, in addition to those described and shown here, but these are not necessary for an understanding of the present disclosure.

FIG. 6 shows the communications device 230 having an antenna 232, which is suitable for transmitting and receiving wireless signals.

FIG. 6 shows the device having transmit circuitry 234, for generating signals that are suitable for transmission, but it will be appreciated that the present disclosure relates also to devices that are suitable only for receiving signals.

FIG. 6 shows a receiver circuit 236, which may be a receiver circuit as shown in FIG. 3 or 4, and as described with reference thereto.

In this example, the receiver circuit 236 supplies the output signal thereof to a processor 238, which demodulates and decodes the signals, and performs any necessary signal processing tasks. The processor 238 is in communication with a memory 240.

FIG. 6 also shows a local oscillator signal generator 242, for supplying suitable local oscillator signals to the receiver circuit 236, for use in the receiver circuit 236 as described with reference to FIGS. 3 and 4.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

The invention claimed is:

1. A receiver circuit comprising:
   an input configured to receive a radio frequency signal;
   an output configured to provide an output signal of the receiver circuit;
   a receive path connected between the input and the output of the receiver circuit;
   a feedback path with an input of the feedback path connected to the output of the receiver circuit; and
   a transformer configured to combine an output signal of the feedback path with the received radio frequency signal in the receive path to form a first signal;
   wherein the receive path comprises a first mixer configured to downconvert the first signal by a local oscillator frequency and an amplifier configured to amplify the downconverted first signal;
   wherein the feedback path comprises a second mixer configured to upconvert a signal in the feedback path by said local oscillator frequency.

2. The receiver circuit according to claim 1, wherein the input, the output, the receive path and the feedback path comprise respective first and second signal lines, such that the receiver circuit is configured to handle differential signals.

3. The receiver circuit according to claim 1, wherein the transformer comprises a first winding connected to the input for receiving the radio frequency signal and a second winding connected to the feedback path, and wherein there is a mutual inductance between the first winding and the second winding such that the output signal of the feedback path is combined with the received radio frequency signal.

4. The receiver circuit according to claim 3,
   wherein the first winding of the transformer comprises a first winding section in the first signal line of the input and a second winding section in the second signal line of the input,
   wherein the second winding of the transformer comprises first and second segments connected between the first signal line and the second signal line of the feedback path,
   wherein there is a mutual inductance between the first winding section of the first winding and the first segment of the second winding, and
   wherein there is a mutual inductance between the second winding section of the first winding and the second segment of the second winding.

5. The receiver circuit according to claim 1, wherein the first and second mixers are passive mixers.

6. The receiver circuit according to claim 1, wherein the amplifier is a transimpedance amplifier.

7. The receiver circuit according to claim 1, wherein the feedback path comprises a voltage divider.

8. The receiver circuit according to claim 7, wherein the voltage divider is a passive voltage divider.

9. The receiver circuit according to claim 7, wherein the voltage divider is located before the second mixer in the feedback path.

10. The receiver circuit according to claim 1, wherein the receiver circuit is a multi-phase receiver.

11. The receiver circuit according to claim 10, comprising a plurality of receive paths, a plurality of feedback paths, and at least one transformer for combination of the respective output signals of the feedback paths with the received radio frequency signal in the receive paths, wherein local oscillator signals supplied to respective first mixers in the respective receive paths have a phase difference therebetween.

12. The receiver circuit according to claim 10, wherein the receiver circuit is at least a three-phase receiver.

13. The receiver circuit according to claim 11, wherein the receiver circuit is a multi-phase receiver, and wherein the multi-phase receiver is a quadrature receiver, comprising respective receive paths and feedback paths for in-phase and quadrature signals.

14. The receiver circuit according to claim 1, wherein an effect of the combination of the output signal of the feedback path and the received radio frequency signal is to change an input impedance of the receiver.

15. The receiver circuit according to claim 1, comprising a filter, in at least one of the receive path and the feedback path, configured to attenuate out-of-band signals.

16. The receiver circuit according to claim 1, wherein the transformer is configured to subtract the output signal of the feedback path from the received radio frequency signal to form the first signal.

17. The receiver circuit according to claim 1, wherein the receive path further comprises a filter configured to filter the downconverted first signal as amplified by the amplifier, wherein an output of the filter is the output of the receiver circuit such that the input of the feedback path is the downconverted first signal as amplified by the amplifier and as filtered by the filter.

18. A communications device comprising a receiver circuit, wherein the receiver circuit comprises:

an input configured to receive a radio frequency signal;

an output configured to provide an output signal of the receiver circuit;

a receive path connected between the input and the output of the receiver circuit;

a feedback path with an input of the feedback path connected to the output of the receiver circuit; and a transformer configured to combine an output signal of the feedback path with the received radio frequency signal in the receive path to form a first signal;

wherein the receive path comprises a first mixer configured to downconvert the first signal by a local oscillator frequency and an amplifier configured to amplify the downconverted first signal;

wherein the feedback path comprises a second mixer configured to upconvert a signal in the feedback path by said local oscillator frequency.

19. The communications device according to claim 18, wherein the input, the output, the receive path and the feedback path comprise respective first and second signal lines, such that the receiver circuit is configured to handle differential signals.

20. The communications device according to claim 18, wherein the transformer comprises a first winding connected to the input for receiving the radio frequency signal and a second winding connected to the feedback path, and wherein there is a mutual inductance between the first winding and the second winding such that the output signal of the feedback path is combined with the received radio frequency signal.

21. The communications device according to claim 20, wherein the first winding of the transformer comprises a first winding section in the first signal line of the input and a second winding section in the second signal line of the input, wherein the second winding of the transformer comprises first and second segments connected between the first signal line and the second signal line of the feedback path, wherein there is a mutual inductance between the first winding section of the first winding and the first segment of the second winding, and wherein there is a mutual inductance between the second winding section of the first winding and the second segment of the second winding.

22. The communications device according to claim 18, wherein the first and second mixers are passive mixers.

23. The communications device according to claim 18, wherein the feedback path comprises a voltage divider located before the second mixer in the feedback path.

24. The communications device according to claim 18, wherein the receiver circuit is a multi-phase receiver.

25. The communications device according to claim 24, comprising a plurality of receive paths, a plurality of feedback paths, and at least one transformer for combination of the respective output signals of the feedback paths with the received radio frequency signal in the receive paths, wherein local oscillator signals supplied to respective first mixers in the respective receive paths have a phase difference therebetween.

26. The communications device according to claim 25, wherein the receiver circuit is a multi-phase receiver, and wherein the multi-phase receiver is a quadrature receiver, comprising respective receive paths and feedback paths for in-phase and quadrature signals.

27. The communications device according to claim 18, comprising a filter, in at least one of the receive path and the feedback path, configured to attenuate out-of-band signals.

28. The communications device according to claim 18, wherein the communications device is a User Equipment device or a network node of a wireless communications network.

29. The communications device according to claim 18, wherein the transformer is configured to subtract the output signal of the feedback path from the received radio frequency signal to form the first signal.

30. The communications device according to claim 18, wherein the receive path further comprises a filter configured to filter the downconverted first signal as amplified by the amplifier, wherein an output of the filter is the output of the receiver circuit such that the input of the feedback path is the downconverted first signal as amplified by the amplifier and as filtered by the filter.

* * * * *